United States Patent
Jung et al.

(10) Patent No.: US 8,772,888 B2
(45) Date of Patent: Jul. 8, 2014

(54) MTJ MRAM WITH STUD PATTERNING

(75) Inventors: Dong Ha Jung, Pleasanton, CA (US);
Kimihiro Satoh, Beaverton, OR (US);
Jing Zhang, Los Altos, CA (US);
Yuchen Zhou, San Jose, CA (US);
Yiming Huai, Pleasanton, CA (US)

(73) Assignee: Avalanche Technology Inc., Fremont, CA (US)

(\*) Notice: Subject to any disclaimer, the term of this patent is extended or adjusted under 35 U.S.C. 154(b) by 0 days.

(21) Appl. No.: 13/572,197

(22) Filed: Aug. 10, 2012

(65) Prior Publication Data

US 2014/0042567 A1     Feb. 13, 2014

(51) Int. Cl.
*H01L 43/00*   (2006.01)
*H01L 43/12*   (2006.01)

(52) U.S. Cl.
USPC ............. 257/421; 257/E43.001; 257/E43.006

(58) Field of Classification Search
USPC ........................... 257/421, E43.001, E43.006
See application file for complete search history.

(56) References Cited

U.S. PATENT DOCUMENTS

| | | | |
|---|---|---|---|
| 2006/0141737 A1 | 6/2006 | Gaidis | |
| 2007/0045758 A1 | 3/2007 | Cao et al. | |
| 2008/0160640 A1 | 7/2008 | Butcher et al. | |
| 2011/0014500 A1* | 1/2011 | Horng et al. | 428/846.3 |
| 2011/0111532 A1* | 5/2011 | Ryu et al. | 438/3 |
| 2011/0272380 A1* | 11/2011 | Jeong et al. | 216/22 |
| 2012/0086089 A1 | 4/2012 | Li et al. | |
| 2013/0119494 A1* | 5/2013 | Li et al. | 257/421 |

\* cited by examiner

*Primary Examiner* — Victor A Mandala
(74) *Attorney, Agent, or Firm* — G. Marlin Knight

(57) ABSTRACT

Use of a multilayer etching mask that includes a stud mask and a removable spacer sleeve for MTJ etching to form a bottom electrode that is wider than the rest of the MTJ pillar is described. The first embodiment of the invention described includes a top electrode and a stud mask. In the second and third embodiments the stud mask is a conductive material and also serves as the top electrode. In embodiments after the stud mask is formed a spacer sleeve is formed around it to initially increase the masking width for a phase of etching. The spacer is removed for further etching, to create step structures that are progressively transferred down into the layers forming the MTJ pillar. In one embodiment the spacer sleeve is formed by net polymer deposition during an etching phase.

4 Claims, 22 Drawing Sheets

MTJ MRAM WITH STUD PATTERNING

FIELD OF THE INVENTION

The present invention relates generally to designs and fabrication methods for non-volatile magnetic random access memory (MRAM) and particularly to methods for fabricating resistive memory cells for non-volatile MRAM incorporating a small feature size magnetic tunnel junction (MTJ).

BACKGROUND

The memories such as RRAM (Resistive Random Access Memory), PRAM (Phase Change Random Access Memory), and MRAM (Magnetic Random Access Memory) have a resistive device as a memory element. The high speed access and the non-volatility at power off of these devices are promising technologies to replace existing memories.

The resistive memory device consisting of a top electrode, a bottom electrode and the resistive memory element in between is fabricated in a pillar shape using a conventional lithography and dry etching process. The memory element MTJ (Magnetic Tunnel Junction) includes at least a pinned layer, a free layer and barrier layer in between. The conventional patterning of MRAM cells includes hard mask patterning, top electrode patterning, MTJ patterning and bottom electrode patterning processes. The bottom electrode is connected to a control device such as a transistor or a diode. After the layers of the memory cell have been patterned, the top electrode is connected to a bit line in a series of process steps which create metal interconnect wires that are insulated by dielectric material.

FIG. 1 illustrates a cross sectional view, perpendicular to the substrate surface, at a selected stage during a conventional prior art fabrication process of an MTJ MRAM cell 001 which has been patterned into a pillar shape on landing pad (contact stud) 101. The domed-shape of top electrode 002 is undesirable and results from the conventional RIE process for the MTJ stack. Since there is no known material that will work as a hard mask for both MTJ and top electrode etching, the top electrode 002 is partially eroded during the etching cycle as shown. In this example, the top electrode sidewall is highly tapered with little remaining material at the edges which will minimize the process margin for the subsequent upper bit line interconnection process. The small remaining thickness of top electrode material does not provide enough margin for process variations and can lead to low yields.

The MTJ layers and bottom electrode are etched conventionally with ion milling or high biased reactive ion etching where elements are mainly removed mechanically. Stray material created by such mechanical etching is easily re-deposited on exposed surfaces such as the sidewalls of the MTJ. The re-deposited material can be electrically conductive and can result in an inoperable MTJ when it is deposited on the side of barrier layer, causing with an electrical short between the free layer and the pinned layer. Potential sources of the re-deposition metal include the MTJ stack itself and the metal that was deposited and patterned before the MTJ layer stack including the contact stud 101. After the unmasked material in the bottom electrode layer is etched away, additional metal structures that were deposited and patterned previously are now exposed to the etching ambient. These previous structures include not only the MTJ contact stud but also peripheral circuitry. Thus there are several sources of metal that can be sputtered out and then re-deposited on the sidewall of the pillar.

The source of the re-deposition metal is generally reduced after the MTJ and bottom electrode is completely etched out. However, misalignment of MTJ and the contact stud 101 will result in part of the surface of the contact stud being exposed after bottom electrode etching. This exposed metal can be sputtered out and increase the deleterious re-deposition at the side wall of the barrier layer. Sloped sidewall of the barrier layer also helps to remove the re-deposited material there. Rates of the re-deposition and removal depends on slope of the sidewall oppositely each other. The shallower slope removes the more reposition on the sidewall.

SUMMARY OF THE INVENTION

Embodiments of the invention use a multilayer etching mask that includes a stud mask for MTJ etching to form a sloping sidewall of the barrier layer and to form a bottom electrode that is wider than the rest of the MTJ pillar. The bottom electrode can therefore, be wider (i.e. oversized) than the contact stud and provide increased margin of error for the alignment of the MTJ pillar without increasing the width of the magnetic layers in the MTJ. The first embodiment of the invention described includes a top electrode and a stud mask. In the second and third embodiments the stud mask is a conductive material and also serves as the top electrode.

In the first embodiment full film layers for the bottom electrode, the MTJ layer stack, a capping layer, the top electrode, and an interlayer dielectric are deposited in order. The stud mask is formed in the interlayer dielectric at the selected position for the MTJ cell. The stud mask is formed in the desired shape and size for the MTJ pillar layers other than the bottom electrode, which will be wider than the stud mask. The additional width is achieved by forming a stud spacer sleeve around the sidewalls of the stud mask. The first etching phase uses the stud mask with the spacer sleeve to etch down to the capping layer. This forms the preliminary, oversized top electrode. The stud spacer sleeve is then removed. The resulting step structure has a stud mask on top of a wider top electrode. The next etching phase proceeds down through the capping and MTJ layers to the upper surface of the bottom electrode. The step structure is transferred downward so that capping and MTJ layers are wider than the stud mask. The next etching phase proceeds down through the bottom electrode layer to complete the pillar. The step structure is again transferred downward so that the bottom electrode is wider than the MTJ layers and the stud mask. A capping layer is deposited and a bit line interconnection process is performed.

In the second embodiment full film layers are deposited as in the first embodiment except that the top electrode layer is omitted. The stud mask and spacer sleeve are also formed as in the first embodiment. The first etching phase uses the stud mask with the spacer sleeve to etch down through the capping layer and into the upper magnetic layer. The stud spacer sleeve is then removed. The resulting step structure has a stud mask on top of a wider capping layer and the upper magnetic layer is partially etched. The next etching phase proceeds down through the MTJ layers to the upper surface of the bottom electrode. The step structure is transferred downward so that the MTJ layers are wider than the stud mask. The next etching phase proceeds down through the bottom electrode layer to complete the pillar. The step structure is again transferred downward so that the bottom electrode is wider than the MTJ layers and the stud mask. A capping layer is deposited and a bit line interconnection process is performed.

In the third embodiment full film layers are deposited as in the first embodiment except that the top electrode layer is omitted. The stud mask is formed as in the first and second embodiments, but the spacer sleeve is formed in a different way by manipulating the electrical bias on the substrate during etching. The first etching phase in this embodiment uses the stud mask (without a sleeve) to etch down through the capping layer and into the upper magnetic layer. A polymer stud spacer sleeve is formed during the etching process by polymer redeposition the pillar sidewall by lowering substrate bias power to promote polymer deposition on the side wall of stud mask and upper magnetic layer. The next etching phase proceeds down through the MTJ layers to the upper surface of the bottom electrode. The polymer sleeve step structure is transferred downward so that the MTJ layers are wider than the stud mask. The next etching phase uses higher bias and proceeds down to the bottom electrode layer. The step structure is again transferred downward so that the lower magnetic layer is wider than the stud mask and the pillar tapers toward the top. The next etching phase proceeds through the bottom electrode to complete the pillar. The tapering step structure is again transferred downward so that the bottom electrode is wider than the MTJ layers and the stud mask. Tapering the sidewall helps to prevent metallic re-deposition that bridges a free layer and a pinned layer. A capping layer is deposited and a bit line interconnection process is performed.

BRIEF DESCRIPTION OF THE FIGURES

In FIG. 2 the stud mask is patterned using conventional lithography process.

FIG. 3 illustrates a cross sectional view of a process stage subsequent to that of FIG. 2 after stud mask (SM) etching and photoresist strip process has been performed.

FIG. 4 illustrates a cross sectional view of a process stage subsequent to that of FIG. 3 after SM deposition has been performed.

FIG. 5 illustrates a cross sectional view of a process stage subsequent to that of FIG. 4 after planarization using SM CMP has been performed.

FIG. 6 illustrates a cross sectional view of a process stage subsequent to that of FIG. 5 after ILD2 removal process has been performed.

FIG. 7 illustrates a cross sectional view of a process stage subsequent to that of FIG. 6 after stud spacer deposition has been performed.

FIG. 8 illustrates a cross sectional view of a process stage subsequent to that of FIG. 7 after stud spacer open etching has been performed.

FIG. 9 illustrates a cross sectional view of a process stage subsequent to that of FIG. 8 after top electrode etching has been performed.

FIG. 10 illustrates a cross sectional view of a process stage subsequent to that of FIG. 9 after stud spacer removal has been performed.

FIG. 11 illustrates a cross sectional view of a process stage subsequent to that of FIG. 10 after MTJ etching has been performed.

FIG. 12 illustrates a cross sectional view of a process stage subsequent to that of FIG. 11 after BE etching has been performed.

FIG. 13 illustrates a cross sectional view of a process stage subsequent to that of FIG. 12 after capping spacer deposition has been performed.

FIG. 14 illustrates a cross sectional view of a process stage subsequent to that of FIG. 13 after the upper metallization fabrication for bit line interconnection using conventional via has been performed.

FIG. 15 illustrates a cross sectional view of a process stage subsequent to that of FIG. 13 after the upper metallization fabrication for bit line interconnection using conventional via-less scheme has been performed.

In FIG. 16 stud spacer layer deposition process has been performed.

FIG. 17 illustrates a cross sectional view of a process stage subsequent to that of FIG. 16 after stud spacer open etching has been performed.

FIG. 18 illustrates a cross sectional view of a process stage subsequent to that of FIG. 17 after upper magnetic layer etching has been performed.

FIG. 19 illustrates a cross sectional view of a process stage subsequent to that of FIG. 18 after stud spacer removal has been performed.

FIG. 20 illustrates a cross sectional view of a process stage subsequent to that of FIG. 19 after MTJ etching has been performed.

FIG. 21 illustrates a cross sectional view of a process stage subsequent to that of FIG. 20 after bottom electrode (BE) etching has been performed.

FIG. 22 illustrates a cross sectional view of a process stage subsequent to that of FIG. 21 after capping spacer deposition has been performed.

FIG. 23 shows subsequent stage after SM is fabricated.

FIG. 24 illustrates a cross sectional view of a process stage subsequent to that of FIG. 23 after upper magnetic layers are etched using low substrate bias voltage generating polymer deposition on the sidewall of the SM and the side of the etched portion of the upper magnetic layers.

FIG. 25 illustrates a cross sectional view of a process stage subsequent to that of FIG. 24 after MTJ etching has been performed.

FIG. 26 illustrates a cross sectional view of a process stage subsequent to that of FIG. 25 after BE etching has been performed.

FIG. 27 illustrates a cross sectional view of a process stage subsequent to that of FIG. 26 after capping spacer deposition has been performed.

DETAILED DESCRIPTION OF THE INVENTION

In the following description of the embodiments, reference is made to the accompanying drawings that form a part hereof, and in which is shown by way of illustration of specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. The cross section view in the figures is generally taken through the approximate center the memory cell in a plane perpendicular to the substrate unless otherwise noted. Although only one cell is shown in the figures, the method may be used for the simultaneous fabrication of a many cells on a wafer according to standard techniques.

First Embodiment

Figure 1:
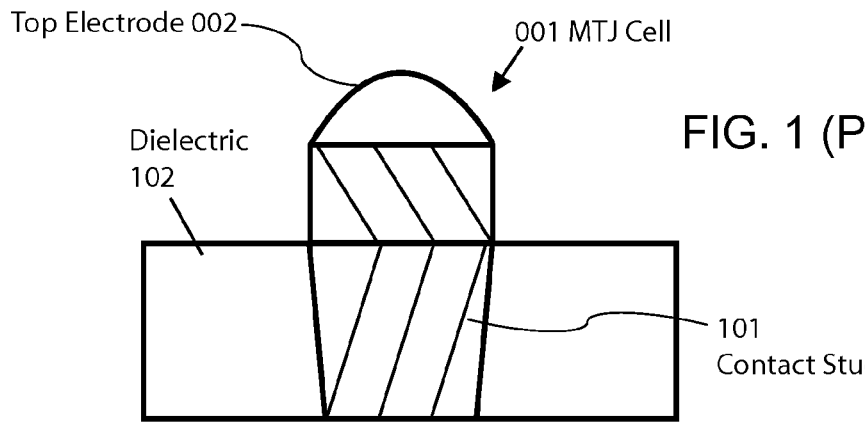
FIG. 1 illustrates a cross sectional view, perpendicular to the substrate surface, of a selected stage of a prior art fabrication process etched using conventional top electrode and MTJ etch process.
Figure 2:
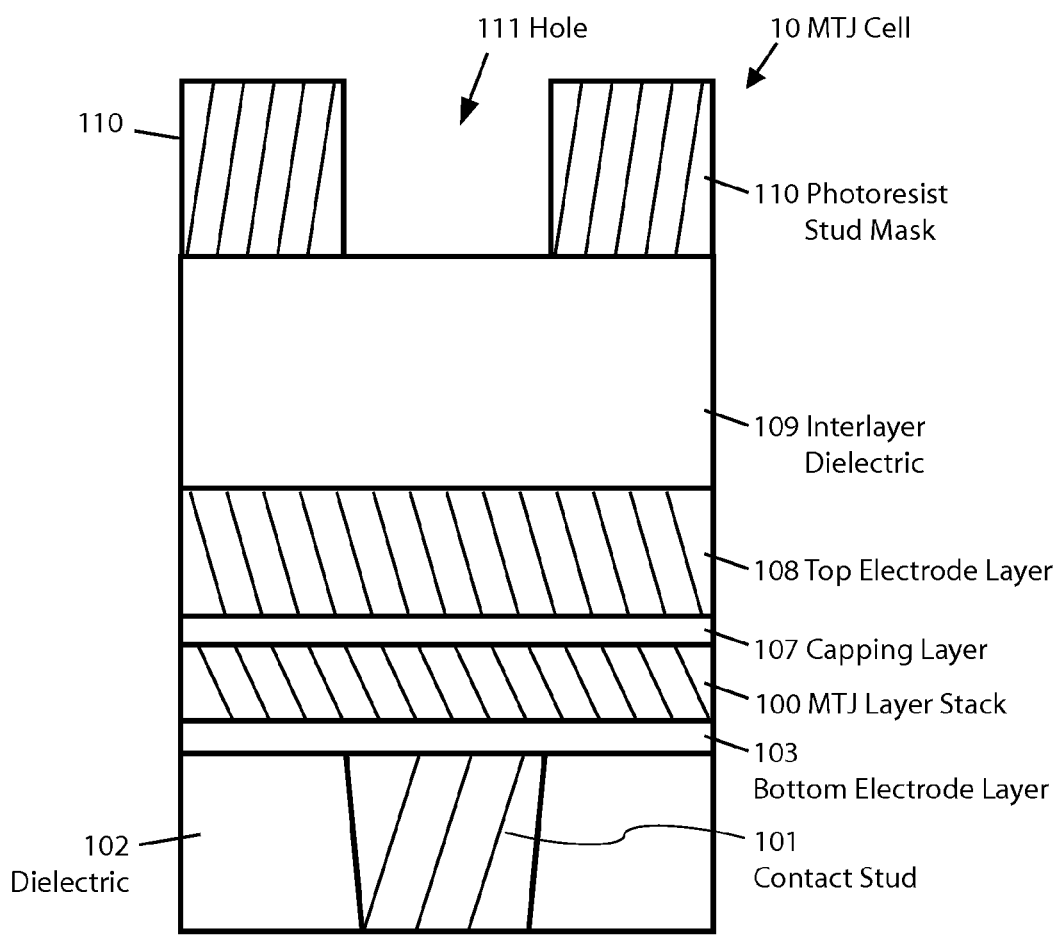
FIGS. 2 to 15 illustrate a cross sectional view, perpendicular to the substrate surface, of selected stages of the fabrication process of MTJ MRAM cells according to the first embodiment of the invention.

FIGS. 2 to 6 will be used to describe the stud mask (SM) fabrication process of the first embodiment of the invention. FIG. 2 illustrates a selected stage of the MTJ MRAM fabrication process for MTJ cell 10. FIG. 2 illustrates that the fabrication process has previously patterned landing pad or contact stud 101 which is isolated by interlayer dielectric layer 102 in the conventional way. The plurality of layers for the MRAM cell have been deposited in sequence over the wafer with no patterning. The lowest layer in the cell is the bottom electrode (BE) layer 103, which is followed by the multiple layers in the MTJ layer stack 100 which includes conventional layers (not shown) such as the free and pinned magnetic layers and the barrier layer. Because the magnetic free layer, for example, can be the upper or the lower magnetic according standard MTJ principles, the following description will typically refer only to the upper and lower magnetic layers with the understanding that the invention is not dependent on the design of the MTJ.

In this embodiment the capping layer 107 is deposited over the MTJ layer stack 100 before top electrode (TE) layer 108. An interlayer dielectric (ILD) 109 is deposited over the TE layer 108. The process in this embodiment continues by depositing and patterning a photoresist stud mask (SM) 110 with hole 111 using conventional photolithography. Hole 111 is centered at the predetermined location where the MTJ MRAM cell pillar will be formed. The size and shape of the hole, which will be used to form the stud mask, is selected to be the desired size shape for the MTJ pillars in the top view. The stud mask will be used as an etching mask for the MTJ pillar. Since the MTJ pillar is typically elliptical, the shape of the hole 111 in a top plan view typically will be elliptical. Any desired shape for the MTJ pillar can be used in embodiments of the invention. In FIG. 2 the width of the hole 111 is equal to the width of the contact stud 101; however, the width of the hole 111 can be smaller or larger than the contact stud 101

Figure 3:
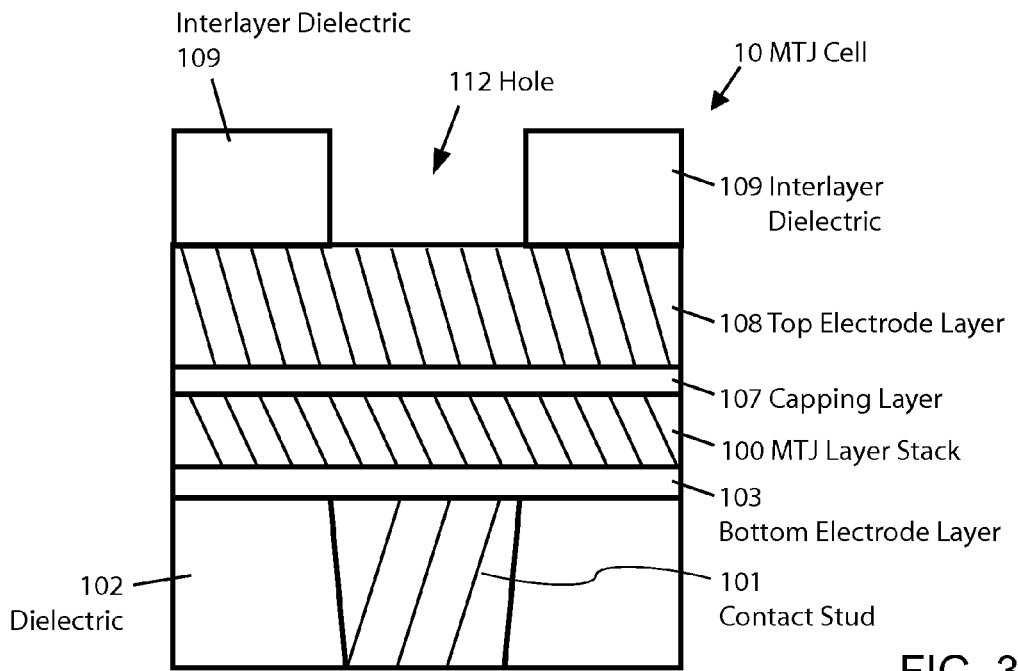

FIG. 3 illustrates a subsequent stage in the process after that shown in FIG. 2. An etching process has been performed using photoresist stud mask (SM) 110 with hole 111 to form a stud hole 112 in the ILD 109 exposing a selected area of the TE layer 108. Thus, hole image 111 in FIG. 2 is transferred into ILD 109 to create stud hole 112. The etching stops when the ILD layer 109 from the exposed area in the hole is totally removed. After etching, the remaining photoresist stud mask (SM) 110 has been stripped away.

Figure 4:
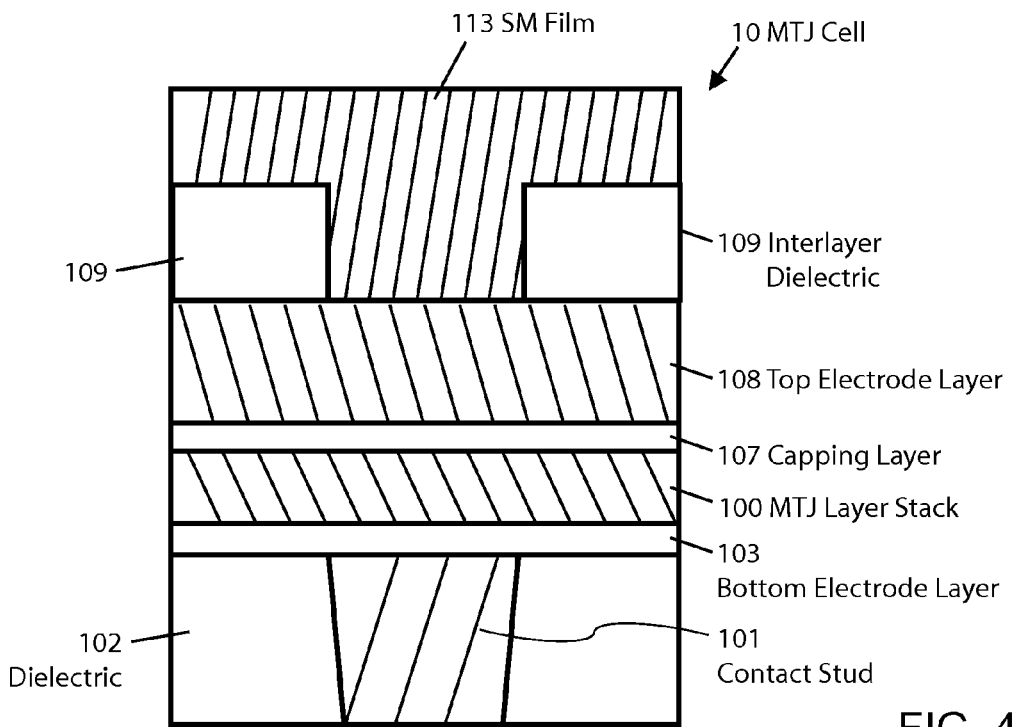
Figure 5:
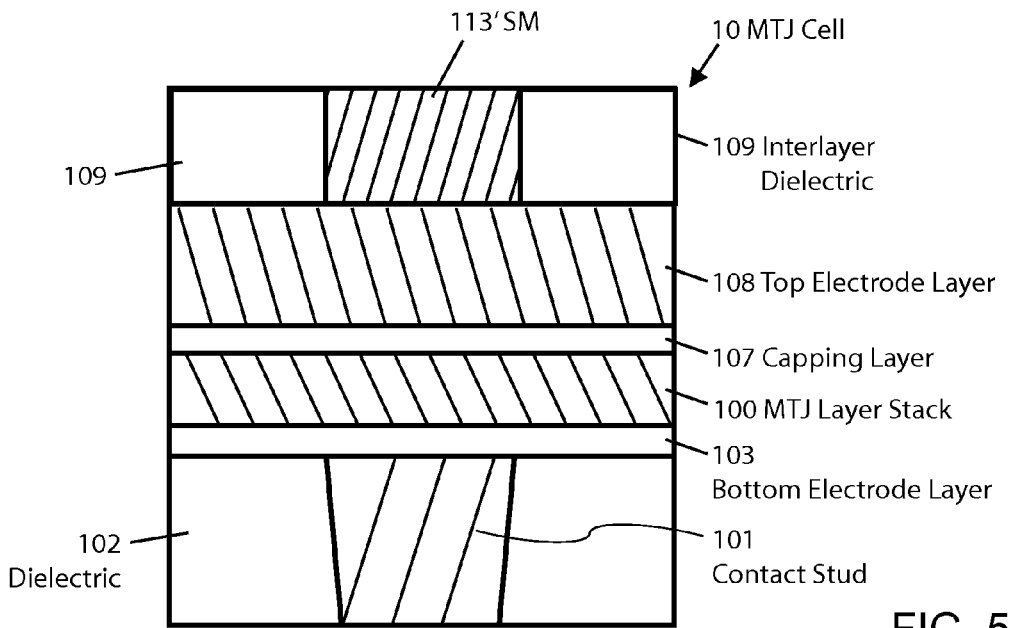
Figure 6:
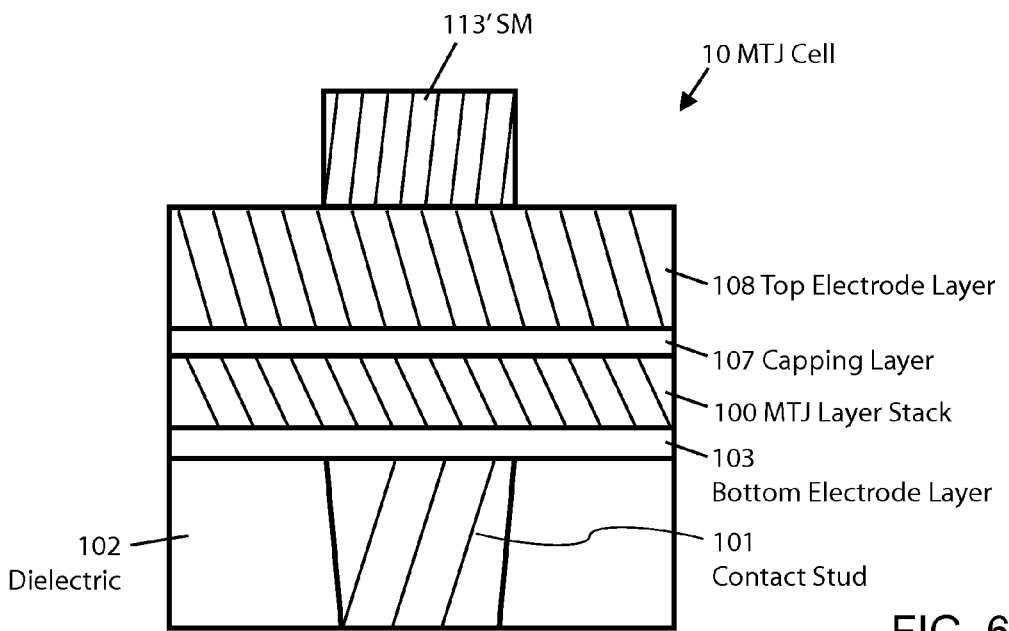

FIG. 4 illustrates a subsequent stage in the process after that shown in FIG. 3. A selected material for SM film 113 has been deposited over the wafer with sufficient thickness to fill hole 112. SM film 113 is in contact with the TE layer 108. The material for the SM film 113 is selected to be electrically conductive and have relatively low etching rate in MTJ etching gas ambient that will be subsequently used. The preferred materials for the SM are copper, tungsten, aluminum, titanium nitride and their substitutes. The excess SM film 113 sitting on ILD 109 outside of the filled hole is removed by chemical-mechanical polishing (CMP). The result as shown in FIG. 5 is the formation of SM 113'. The CMP process isolates each of the plurality of SMs 113' being formed on the wafer from one another and exposes the upper surface the ILD layer 109 between SMs 113'. FIG. 6 illustrates the subsequent stage after the interlayer dielectric layer 109 is removed using wet etching or dry etching. The MTJ stack is protected from the etching by the TE layer 108 after ILD 109 is completely removed.

Figure 7:
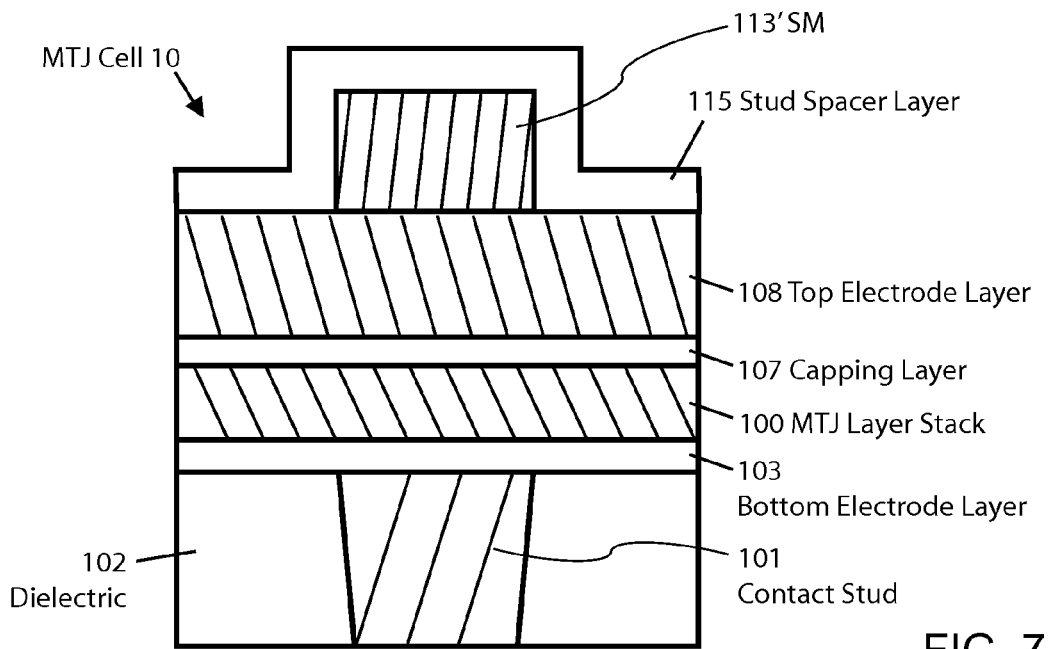
Figure 8:
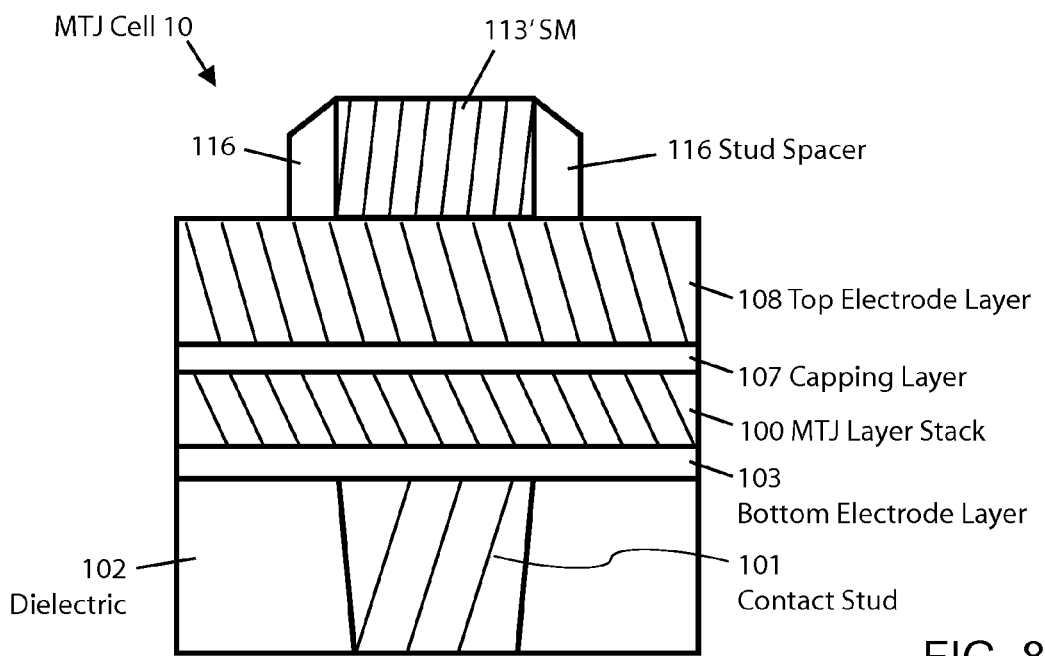
Figure 9:
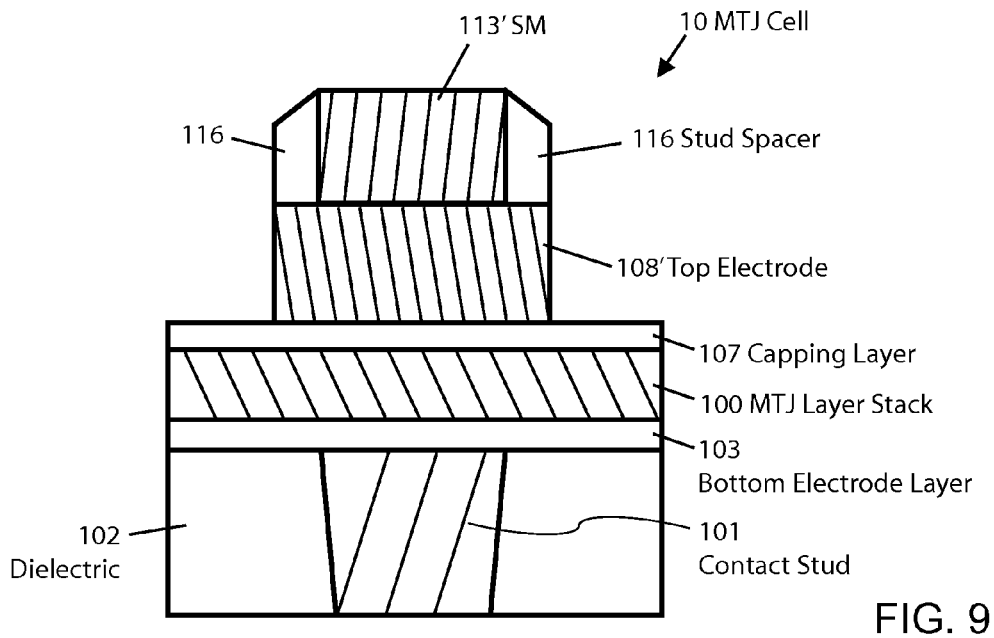

FIGS. 7 and 8 illustrate the fabrication process of the stud spacer sleeve, which will also be referred to more simply as the stud spacer. FIG. 7 illustrates stud spacer layer 115 is deposited over the wafer with sufficient thickness to form a film on the sidewalls of stud mask 113'. The material for the stud spacer is selected so that it can act as a hard mask for the step structure with high selectivity in comparison to metal and MTJ stack materials. The preferred materials for the stud spacer are silicon nitride, aluminum oxide and their substitutes. After the stud spacer layer 115 is deposited, directional etching is performed to leave the stud spacer 116 only on the sidewall of SM 113' as shown in FIG. 8. The stud spacer 116 is shown in vertical cross section in FIG. 8. In a top plan view the stud spacer 116 is a continuous sleeve of material surrounding the sidewalls of SM 113' and conforming to the shape of SM 113', which, for example, can have an elliptical shape. The top surface of the SM 113' will be exposed after this etching process.

The stud spacer 116 will be used as a hard mask to define the step structure of TE 108 and SM 113'.

Figure 10:
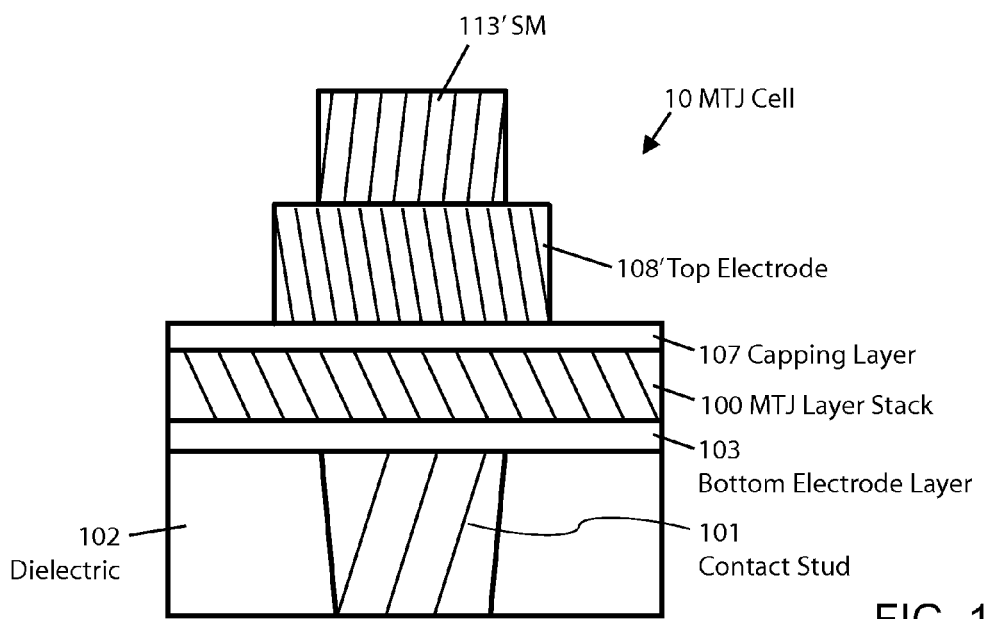

FIGS. 9 to 13 illustrate the phases of MTJ and BE etching. The TE layer 108 etching continues is etched by reaching down to the upper surface of capping layer 107 as shown FIG. 9. The stud spacer 116 is still sitting on the sidewall of SM 113' and has not been removed because vertical etching is used for TE etching. The stud spacer 116 is then removed using wet or dry etching chemistry with the result as shown in FIG. 10. The MTJ layer stack is protected from the etching ambient during the stud spacer removal process by the overlying capping layer 107. Because the stud spacer 116 provides extra masking width beyond SM 113', the result is that the preliminary top electrode (TE) 108' is wider than the SM113'. Since the width of the SM 113' was selected to be approximately the same width as the final MTJ, the TE 108' is wider than the contact stud 101.

Figure 11:
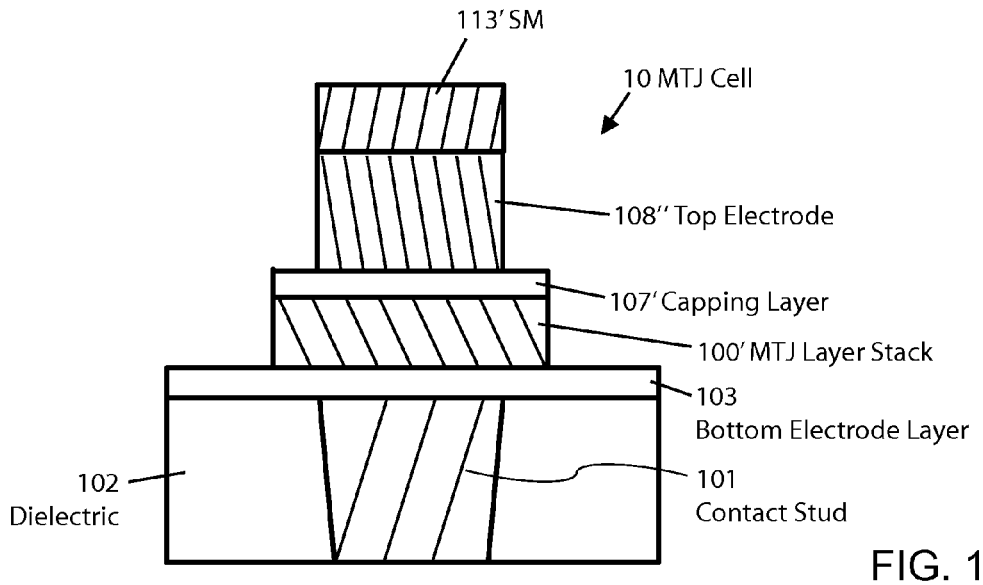

FIG. 11 illustrates the resulting structure after next process phase in which the MTJ layer stack is etched. The etching begins with the structure shown in FIG. 10. The preliminarily defined step structure that includes SM 113' and oversized TE 108' along with the capping layer 107 works as a multilayer etching mask for the MTJ layer stack 100 by using three materials arranged in a particular shape to achieve a masking result that cannot be obtained with a simple mask as will be seen. The oversized TE 108' and the SM 113' work together as a mask to define the shape of the MTJ pillar 100' with the patterned capping layer 107' as shown. The area of capping layer 107 and then MTJ layers 100 that are outside of the oversized TE 108' are subject to etching at the beginning of the process. Thus, the initial protection afforded by the oversized TE 108' is sufficient to cause the final shape of these layers in the pillar to be approximately the shape of the oversized TE 108', i.e. to be wider than the contact stud 101. However, the area of the TE 108' not protected by the SM 113' is also ultimately removed during the etching. Thus, the oversized TE 108' is trimmed to be TE 108" which is the size of the SM 113'. The MTJ etching phase stops when the upper surface of BE layer 103 is fully exposed and the step structure is transferred into patterned MTJ 100' and trimmed TE 108".

Figure 12:
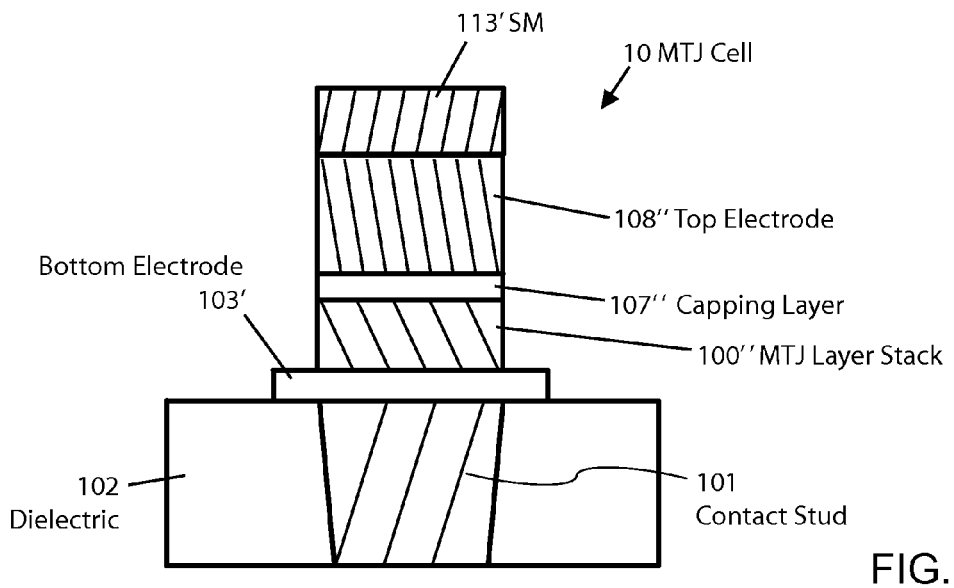

FIG. 12 illustrates the BE etching phase. The step structures of SM 113', TE 108" and MTJ 100' work as the multi-layer etching mask for the BE 103' and the MTJ stack 100". The final structure with larger width of BE 103' and smaller width of the rest of the pillar (MTJ stack 100", TE 108", SM 113') is fabricated when the BE etching is completed.

Figure 13:
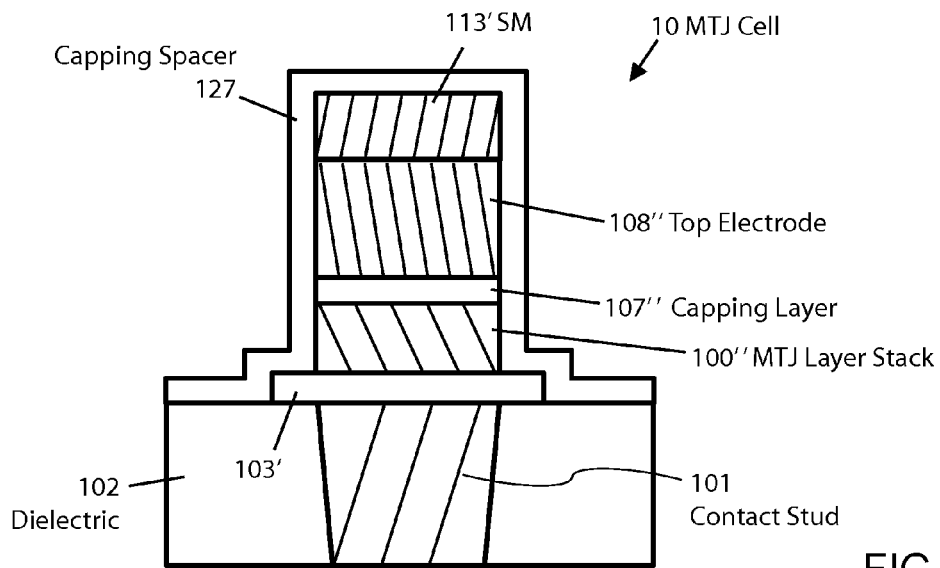

A capping spacer layer 127 is deposited as shown in FIG. 13. A relatively thin oxygen free dielectric film such as a silicon nitride or a silicon carbide is deposited on the MTJ pillar. This dielectric film 127 is deposited to substantially conform to shape of the pillars.

Figure 14:
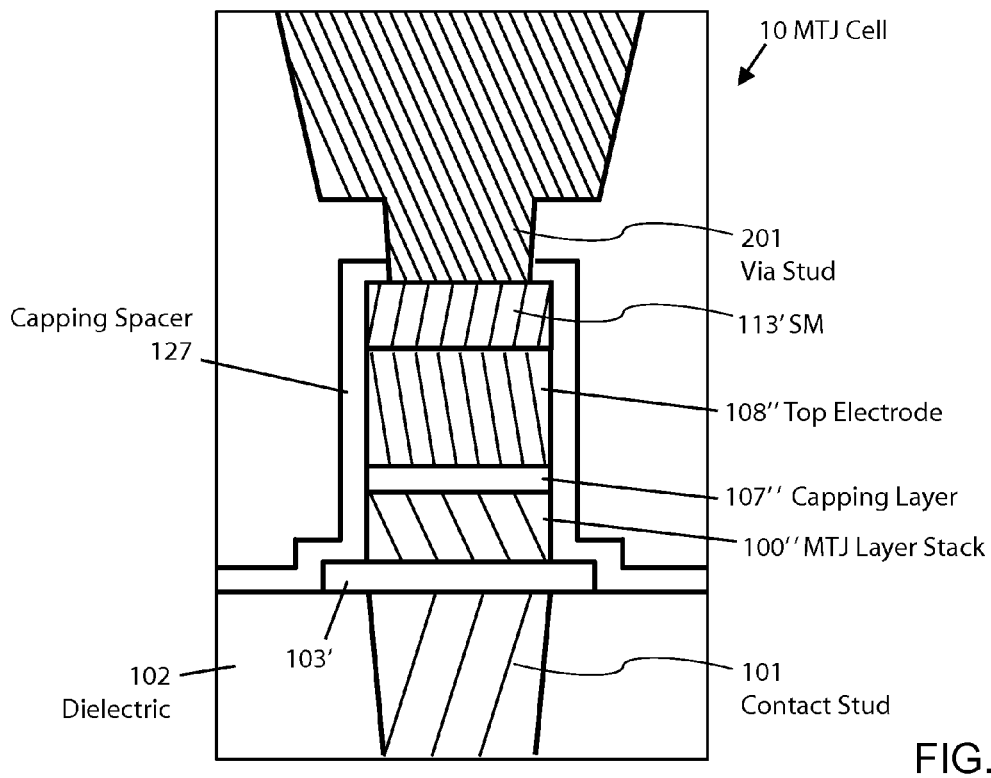
Figure 15:
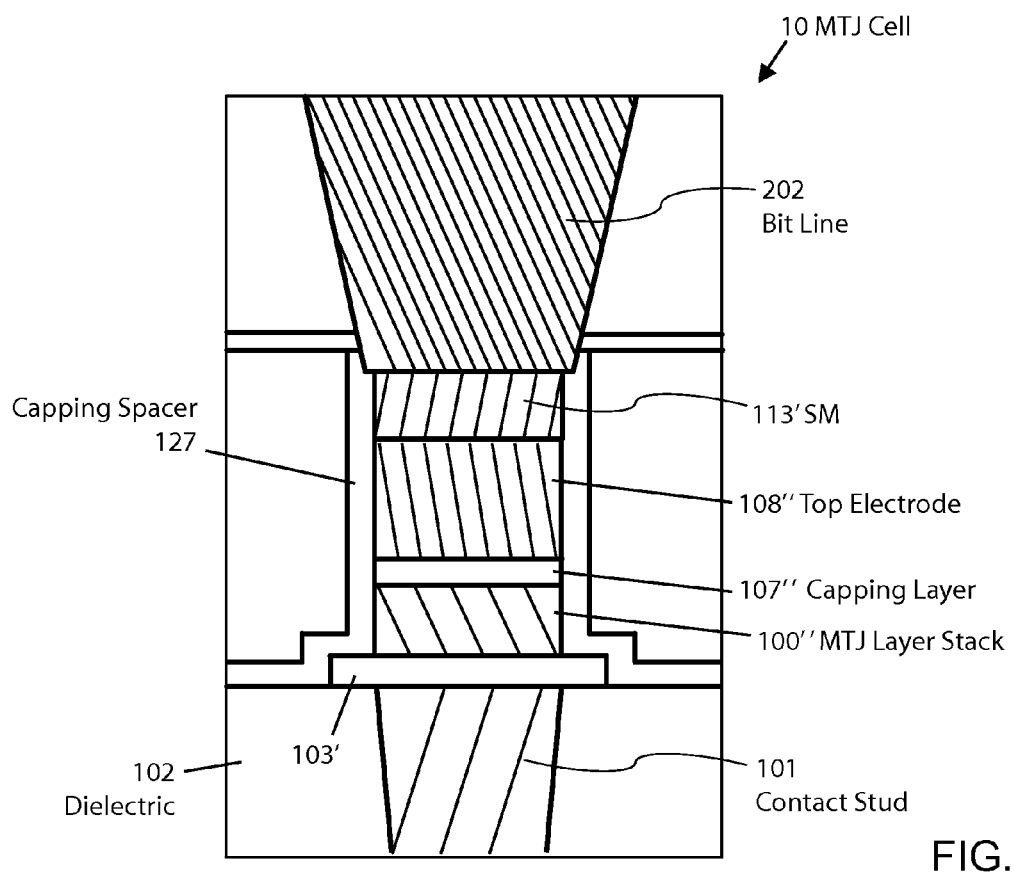

FIGS. 14 and 15 illustrate alternative interconnection process by the conventional art. FIG. 14 illustrates an interconnection scheme is using a via stud 201. FIG. 15 illustrates a bit line 202 interconnection scheme that does not use a via stud.

Second Embodiment

FIGS. 16 to 22 illustrate the second embodiment. In this embodiment the stud mask (SM) 213 also works as a top electrode as well in MTJ Cell 12. The SM 213 fabrication process for the second embodiment of the invention is the same as in the first embodiment except that the SM 213 is formed on top of the capping layer 107 and the SM 213 is preferably thicker than SM 113'. The absence of the separate top electrode layer from the second embodiment results in the exposure of the capping layer where the TE was exposed in the first embodiment. Thus, the capping layer will protect MTJ stacks from the ILD etching ambient.

Figure 16:
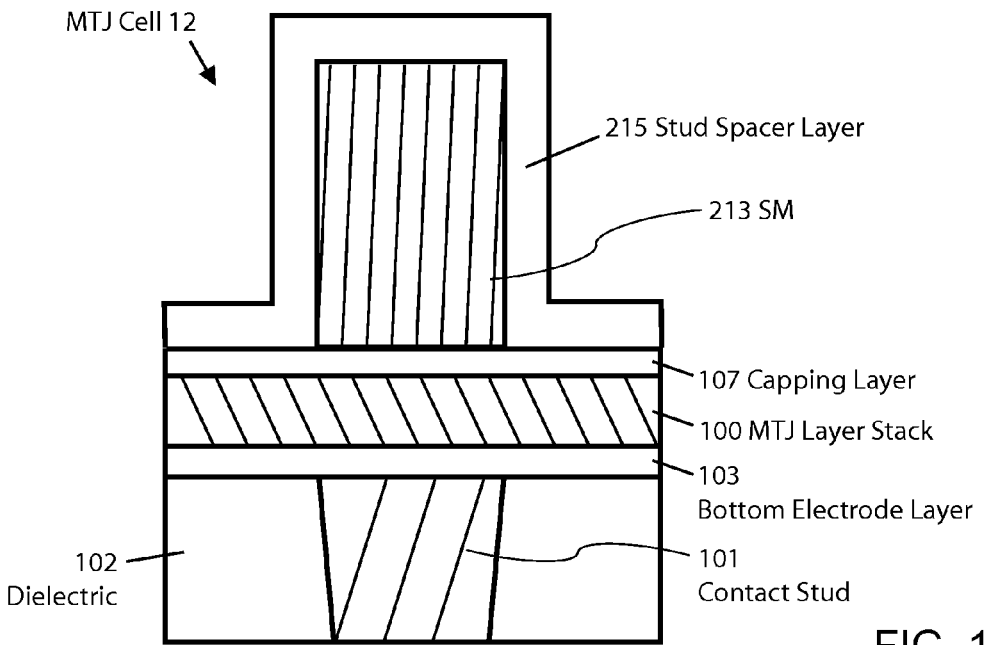
FIGS. 16 to 22 illustrate a cross sectional view, perpendicular to the substrate surface, of selected stages of the fabrication process according to the second embodiment of the invention after initial SM fabrication process.
Figure 17:
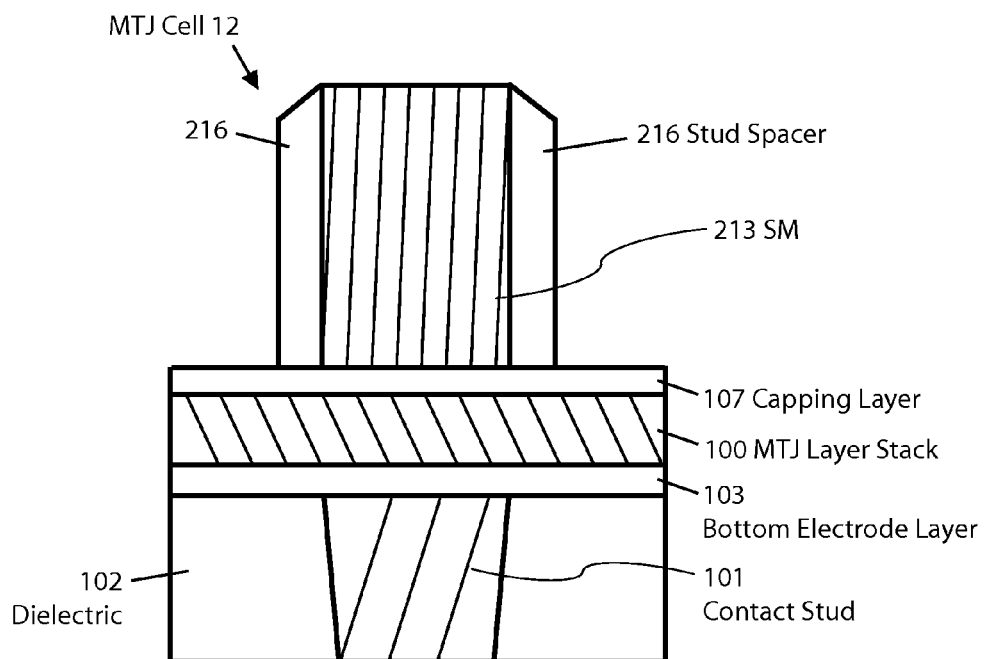

FIGS. 16 and 17 illustrate the fabrication process of the stud spacer 215. In FIG. 16 the stud mask 213 has been patterned as previously described. The stud spacer layer 215 has been deposited to conform to the underlying topography as shown. The material for the stud spacer layer 215 is same as described in the first embodiment. FIG. 17 shows the result of directional etching of the structures in FIG. 16, which leaves the stud spacer 216 only on the sidewalls of SM 213. As described in the first embodiment the stud spacer 216 is a sleeve of material surrounding the SM 213, which is typically elliptically shaped in a top plan view as discussed above. The stud spacer 216 will be used as an etching mask as in the first embodiment.

Figure 18:
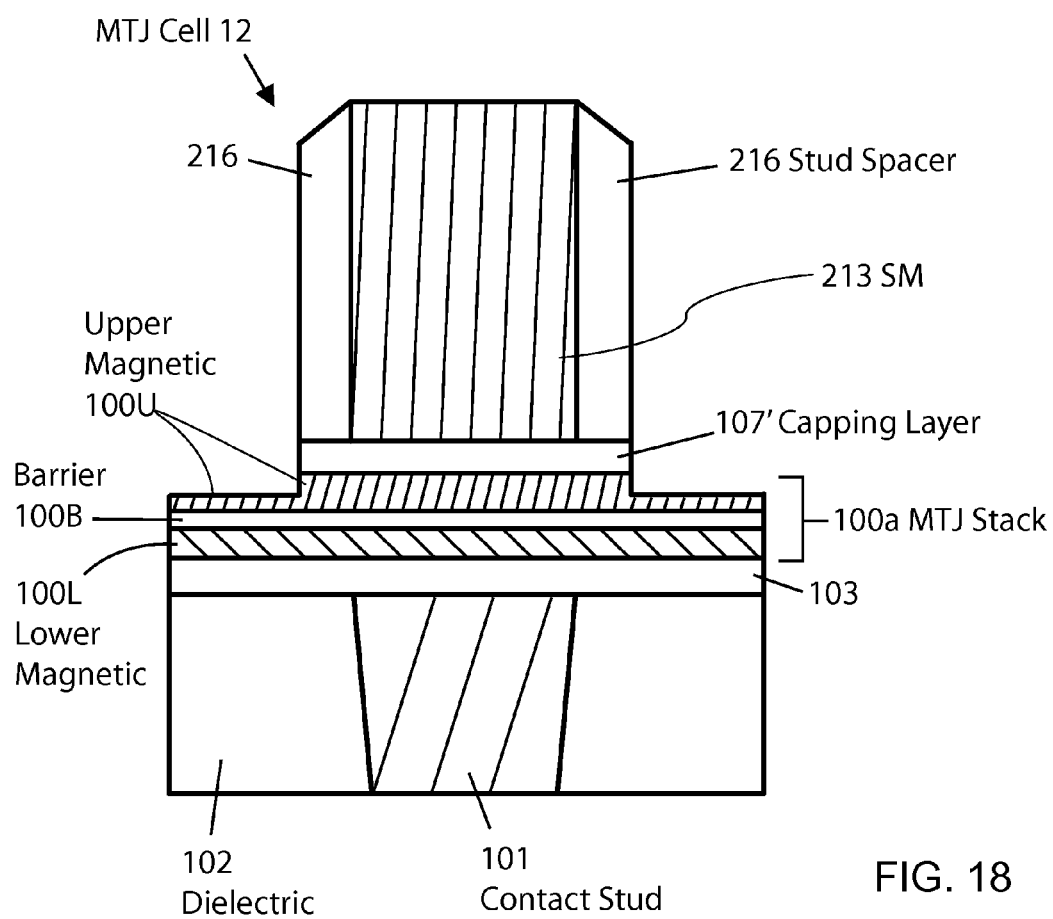

FIGS. 18 to 22 illustrate MTJ through to BE etching. The capping layer 107' and the upper magnetic layer 100U are etched vertically. At this stage MTJ 100a is only partially etched. In one alternative embodiment the etching phase stops before the upper magnetic layer 100U is fully etched as shown in FIG. 18. In another alternative embodiment the etching reaches the tunnel barrier 100B. The stud spacer 216 remains on the sidewall of SM 213 due to the vertical etching during the first MTJ etching phase.

Figure 19:
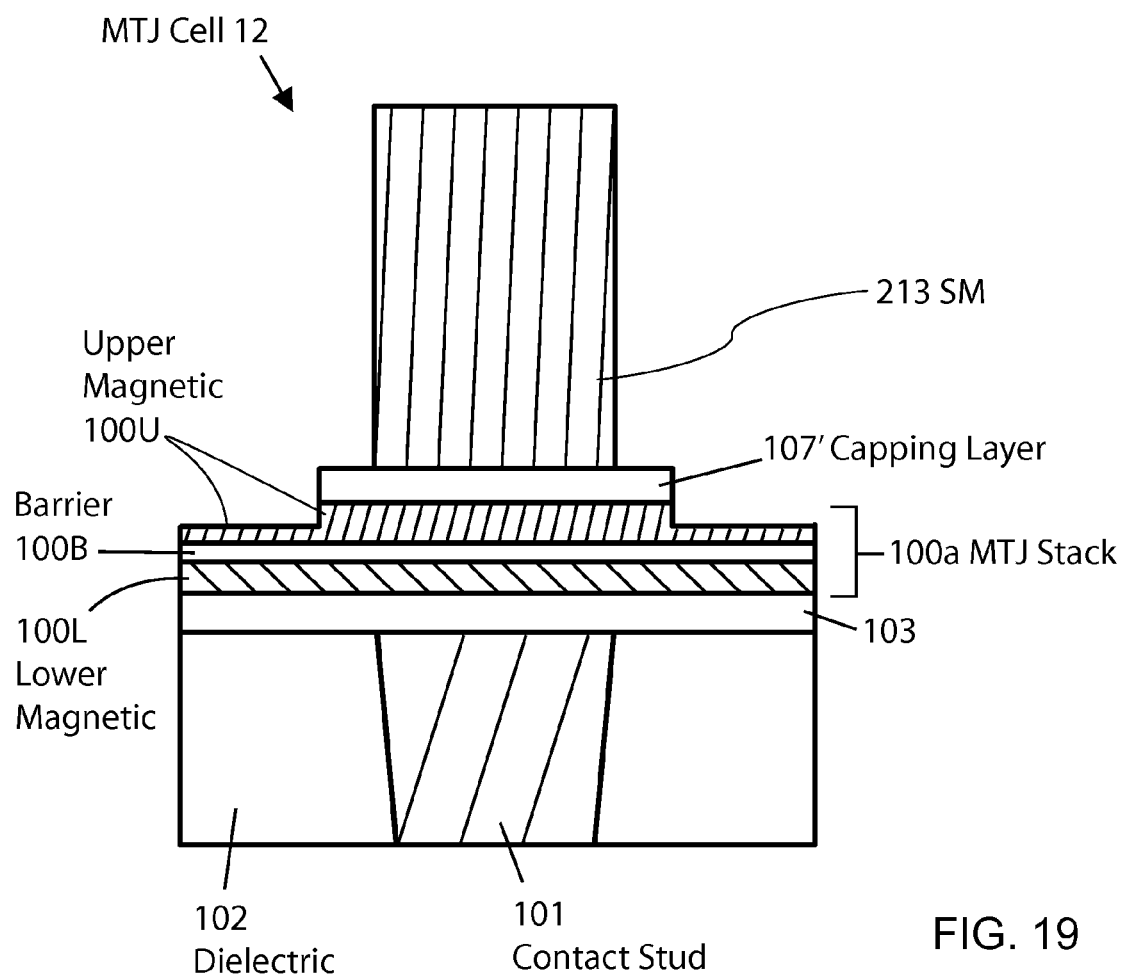

After the stage shown in FIG. 18, the stud spacer 216 is removed using wet or dry etching ambient with the result as shown in FIG. 19. The larger width of the upper magnetic layer 100U with the smaller width of the SM 213 forms the step structure in this manner.

Figure 20:
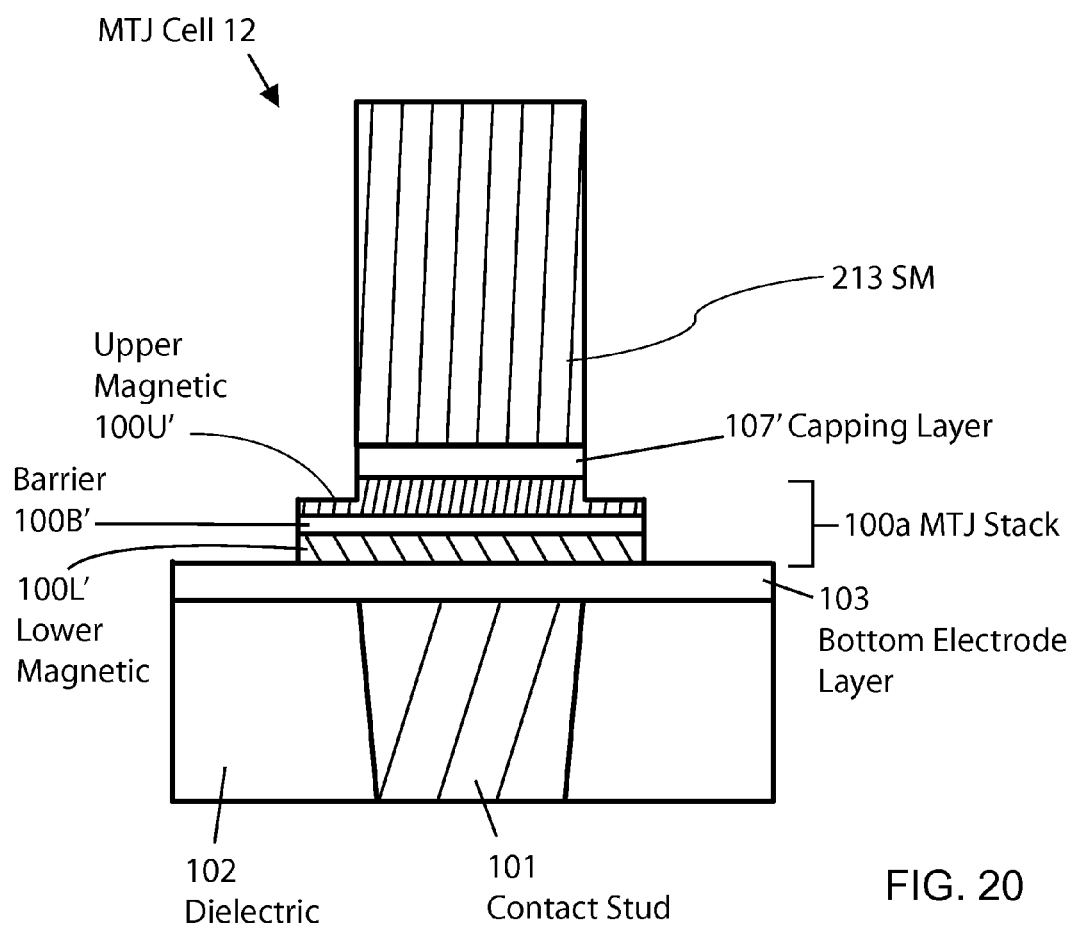

FIG. 20 illustrates the stage after remainder of MTJ stack 100a is etched to form upper magnetic layer 100U', barrier layer 100B' and lower magnetic layer 100L'. The predefined step structure works as the etching mask for the remainder of the MTJ stacks similarly to the first embodiment. The step structure is transferred into the MTJ stack 100a. The MTJ etching stops when the BE layer 103 is fully exposed.

Figure 21:
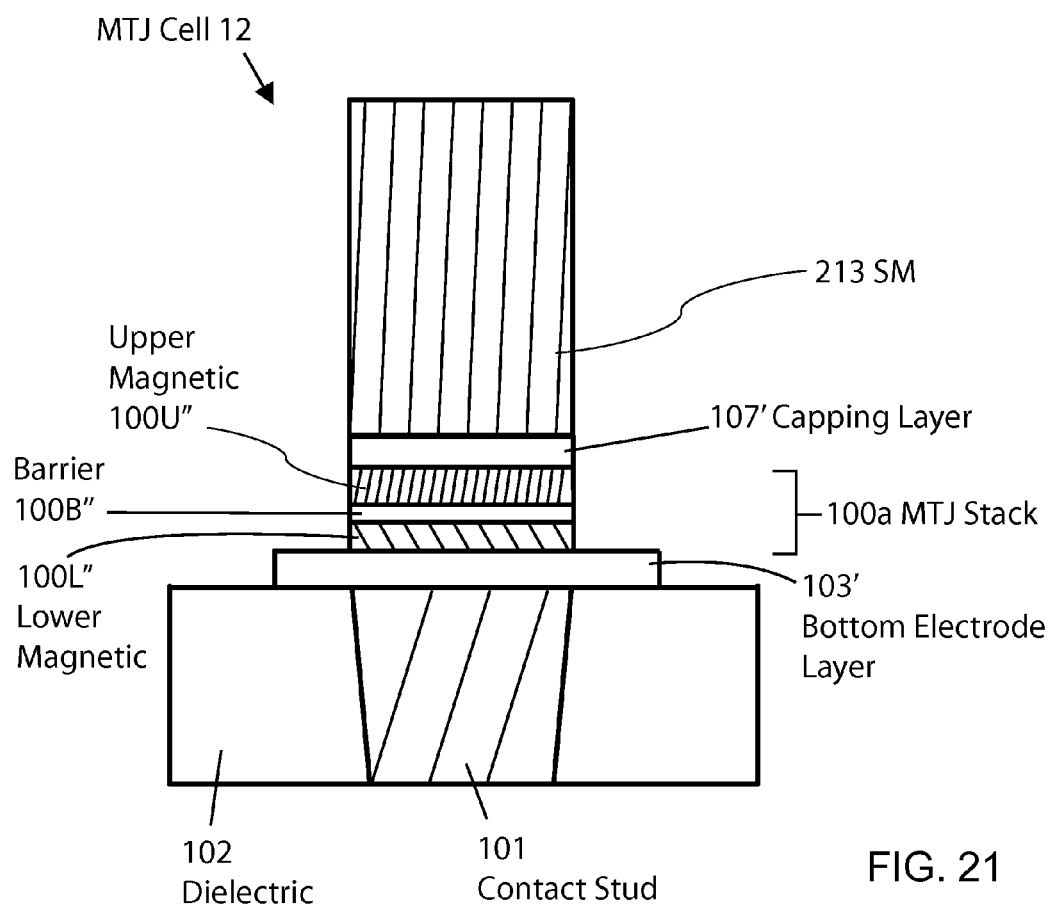
Figure 22:
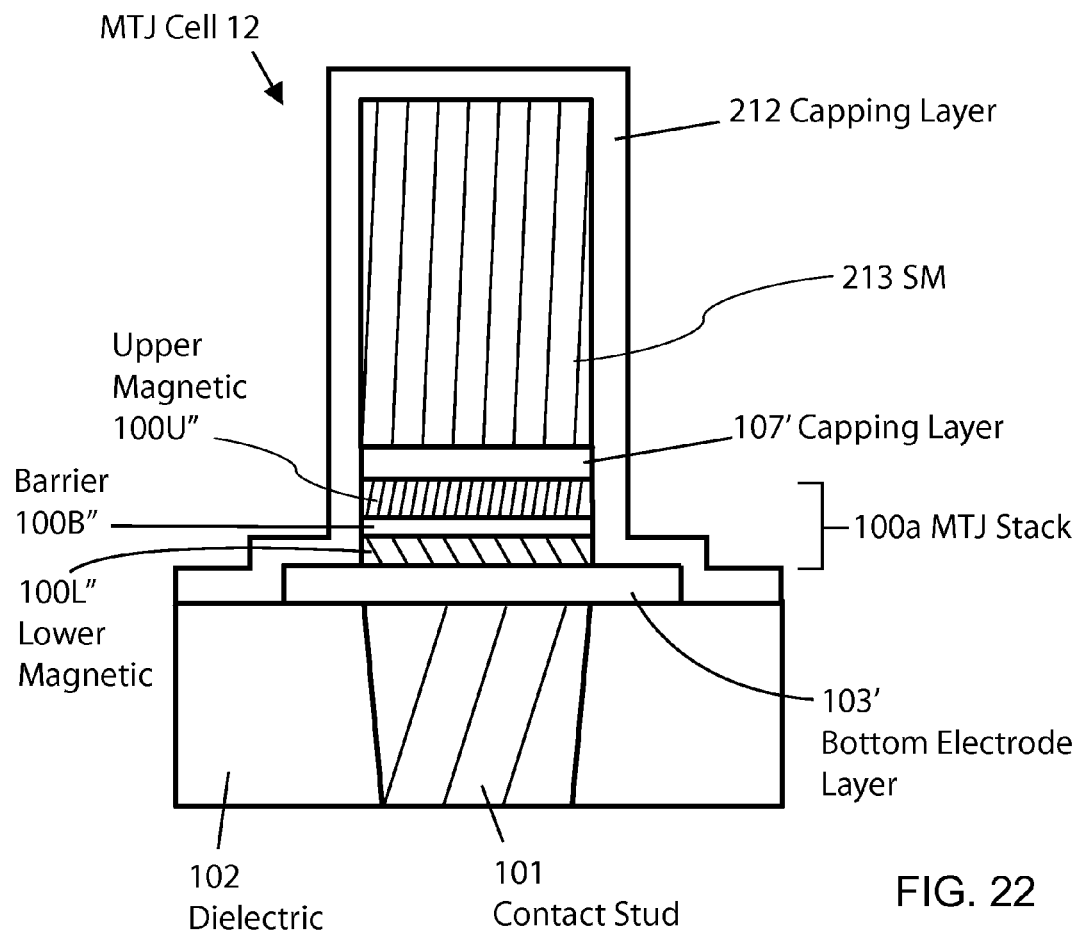

FIG. 21 illustrates BE etching which further trims the magnetic layer 100U", barrier layer 100B" and lower magnetic layer 100L". The predefined step structure of MTJ 100a and SM 213 work together as the etching mask of the BE 103'. The final pillar structure has a BE 103' that is wider than the upper magnetic layer 100U", barrier layer 100B" and lower magnetic layer 100L". When the BE is completely etched, the MTJ cell pillar is in its final shape. As illustrated in FIG. 22, the capping spacer layer 212 is deposited to conform to the topography as the subsequent stage after the etching process is finished. The material used for the capping spacer is same as the one described in the first embodiment of the invention.

From the stage shown in FIG. 22, the process proceeds according to the first embodiment to connect a metal bit line to the stud mask as described in the alternatives shown in FIG. 14 and FIG. 15.

Third Embodiment

Figure 23:
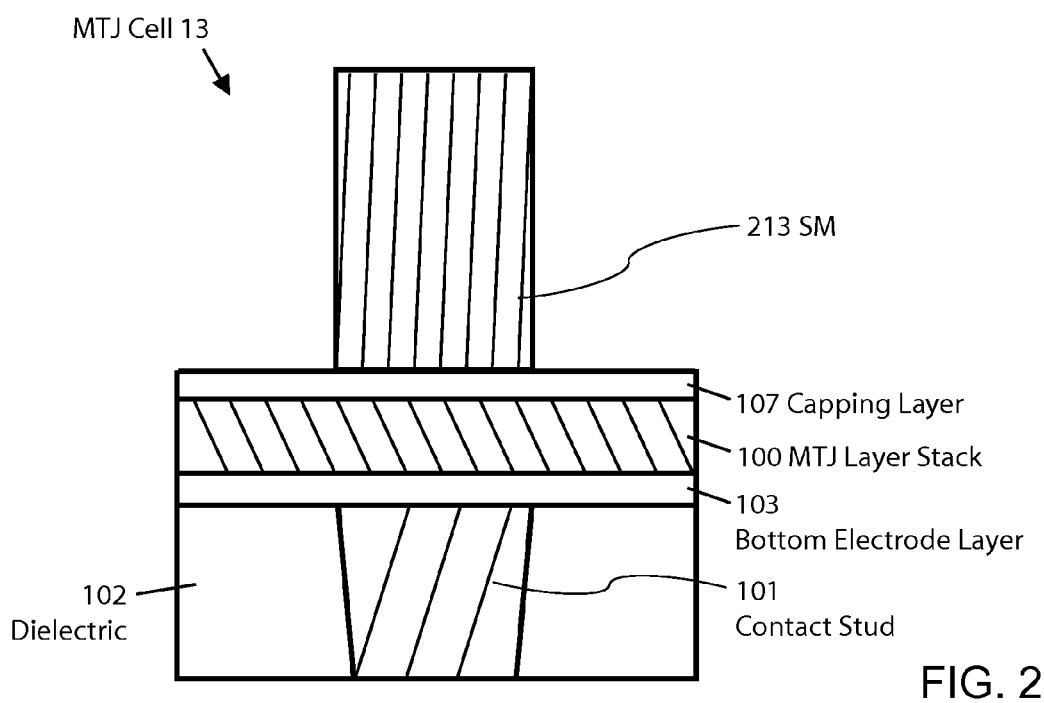
FIGS. 23 to 27 illustrate a cross sectional view, perpendicular to the substrate surface, of selected stages of the fabrication process according to the third embodiment of the invention after initial SM fabrication process. The SM is fabricated in the same manner as the second embodiment of the invention with the absence of top electrode (TE).
Figure 24:
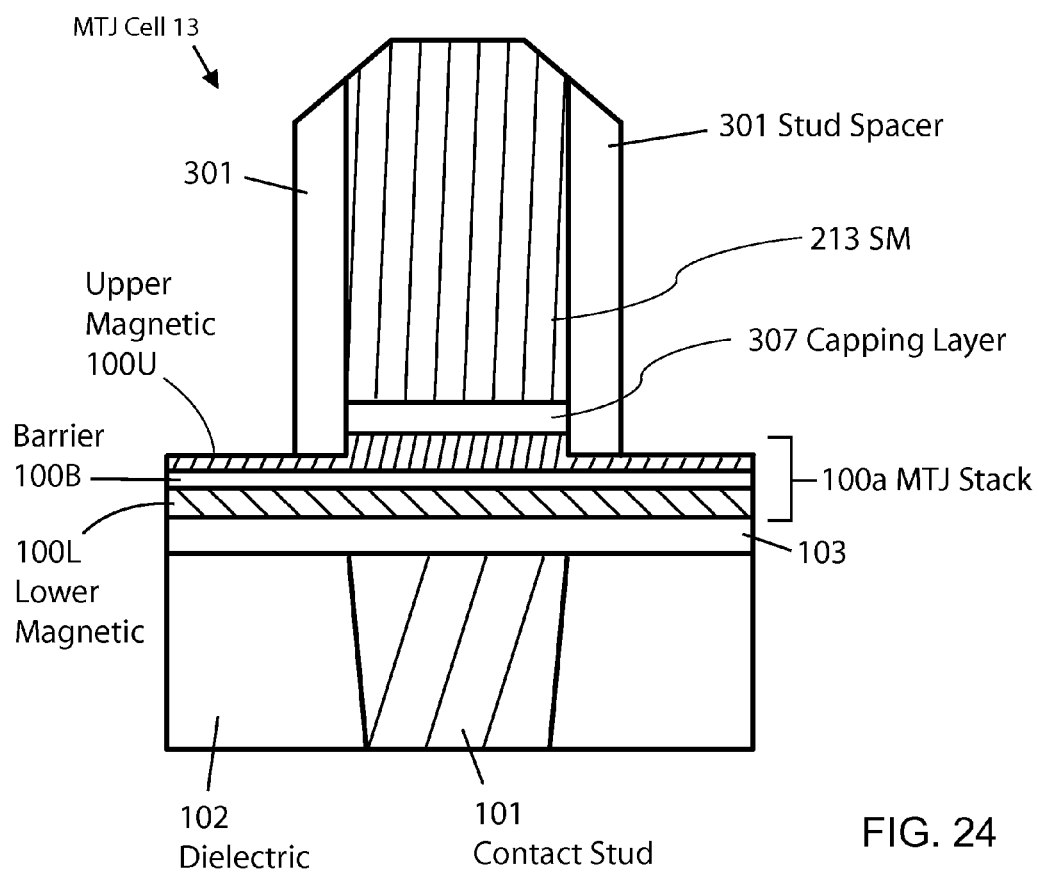

The SM fabrication process for the third embodiment of the invention is processed in the same manner as the second embodiment of the invention with the absence of TE. FIG. 23 illustrates subsequent stage after the SM 213 is fabricated for MTJ Cell 13. The remainder process for the third embodiment is different from the first and the second embodiments of the invention. The stud mask spacer sleeve in this embodiment is formed by polymers created during the etching process. Typically net deposition of materials during an etching process is avoided but this embodiment takes advantage of the phenomenon to achieve a desired result. At first the MTJ etching is performed using standard bias parameters, but when MTJ etching reaches the approximate middle of the upper magnetic layer 100U, the substrate bias is lowered below the standard level to allow a net build up of polymer stud spacer 301 on sidewall of the stud mask and the plateau portion of the upper magnetic layer 100U as shown in FIG. 24. A remaining lower portion of the upper magnetic layer 100U extends under the polymer stud spacer 301 and beyond it. The thickness of the polymer is controlled by the substrate bias power. The thickness increases with decreased substrate bias power and decreases with increased substrate bias power.

Figure 25:
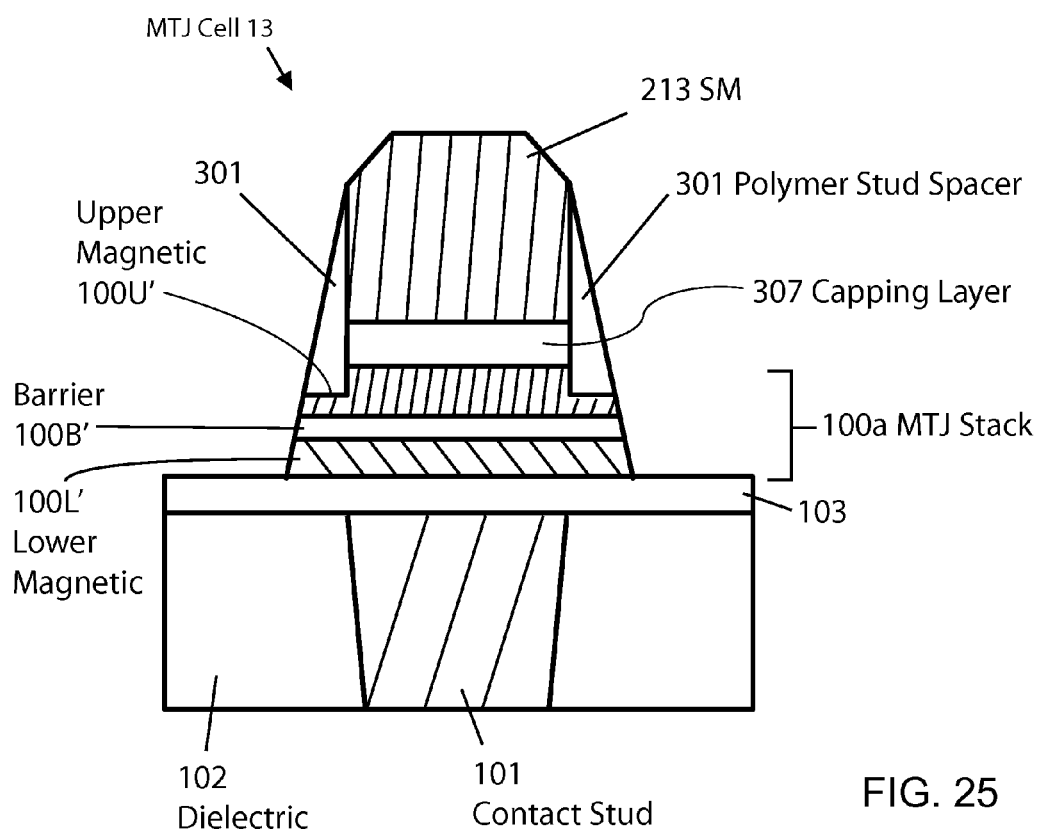

FIG. 25 illustrates the result of etching the structures shown in FIG. 24 with increased substrate bias power. This increased substrate bias is again set to a level that will not generate additional net polymer deposition but will decrease the amount of the sidewall polymer which has been deposited in the previous stage. The etching stops when the unprotected area of the BE 103 is fully exposed as shown in FIG. 25. The sidewall polymer 301 generated from the previous step acts as a spacer for defining the step structure of the pillar. The larger width of the lower magnetic layer 100L' and the smaller width of the upper magnetic layer 100U' with the SM 213 forms the step structure in this manner.

Figure 26:
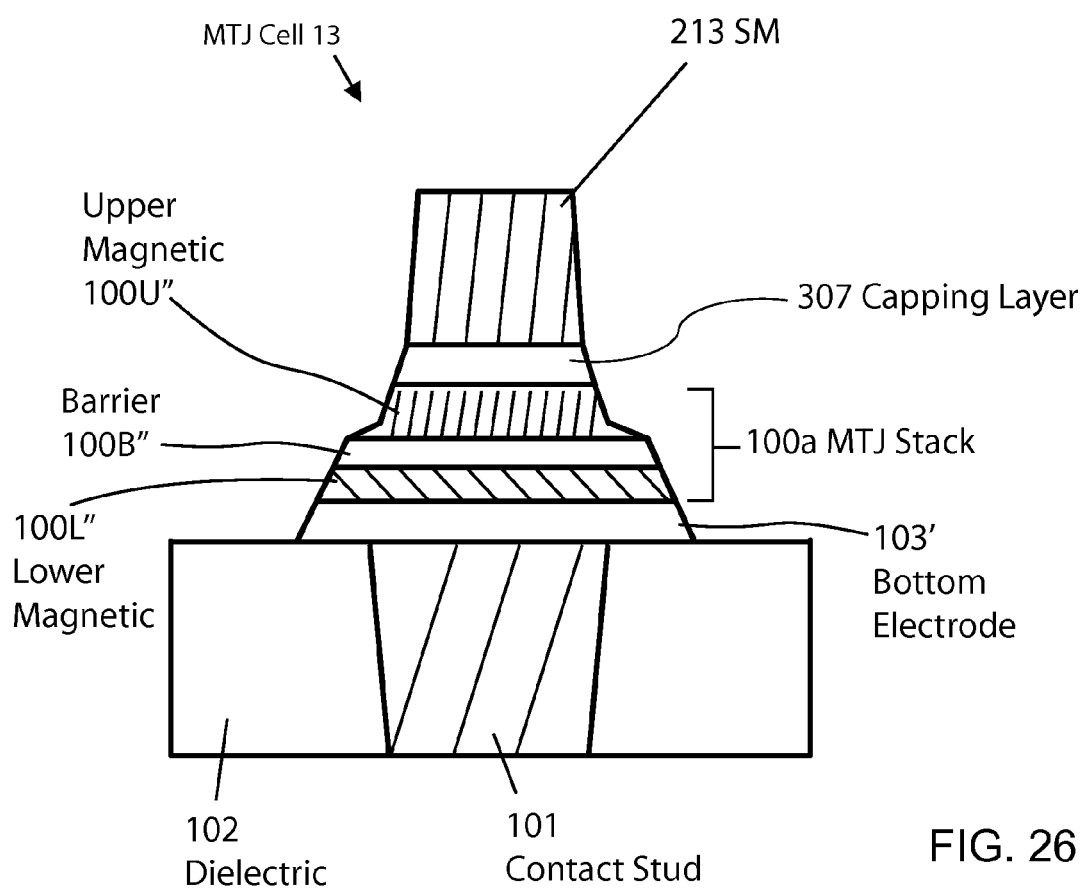

FIG. 26 illustrates the result of etching the structures shown in FIG. 25 with a higher level of substrate bias power selected to perform the bottom electrode 103' etching. The bottom part of the MTJ stack 100a with the larger width lower magnetic layer 100L" works as the etching mask for the BE and the SM 213 works as the etching mask of the bottom part of the MTJ layer stack 100a. The final step structure of BE 103' with lower magnetic layer 100L" having larger width and the remaining structures above (upper magnetic layer 100U", SM 213) having smaller width is fabricated in the final shape when the BE etching stops. Remainder of the sidewall polymer stud spacer 310 material shown in FIG. 25 is completely etched away during the BE etching due to the increase of the physical etching from the increased substrate bias power. The increased portion of the physical etching parameter will additionally result in a tapered angle at the sidewall of the MTJ stack 100a which helps reduce the side wall re-deposition of the metallic particles.

Figure 27:
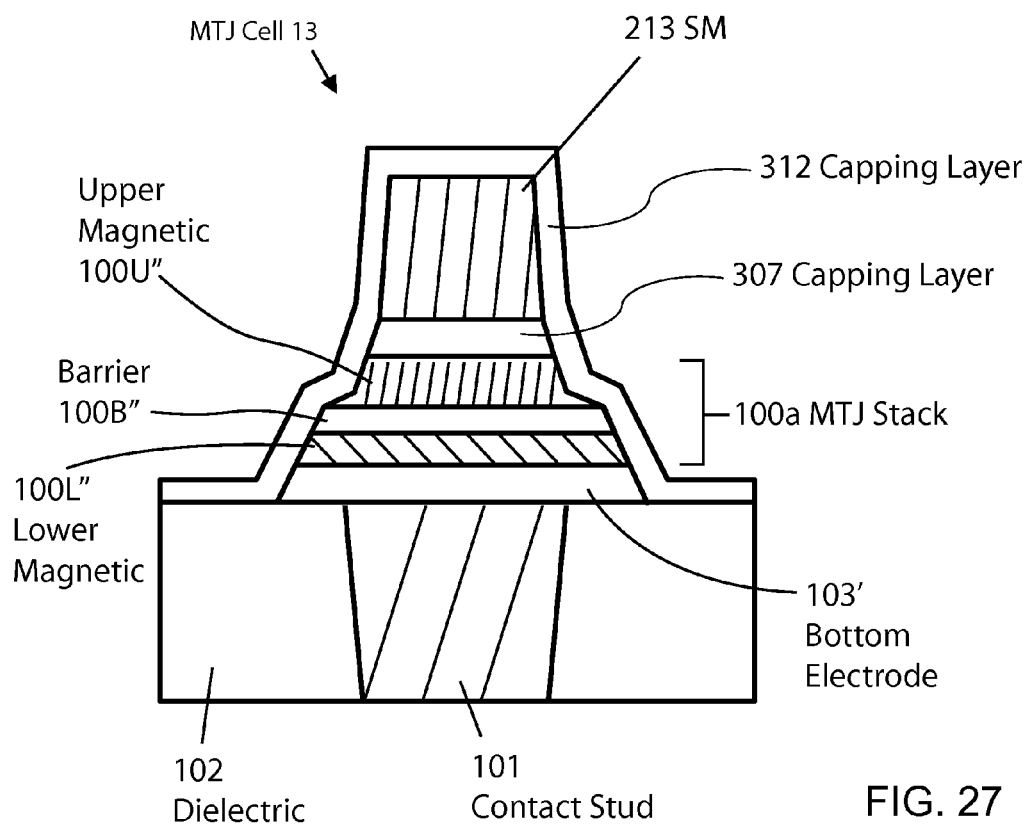

The capping spacer 312 shown in FIG. 27 is deposited as the subsequent stage after the etching process is finished. The material used for the capping spacer is same as the one described in the first embodiment of the invention.

>From the stage shown in FIG. 27, the process proceeds according to the first embodiment to connect a metal bit line to the top electrode contact as described above for FIG. 14 and FIG. 15.

Figure 28:
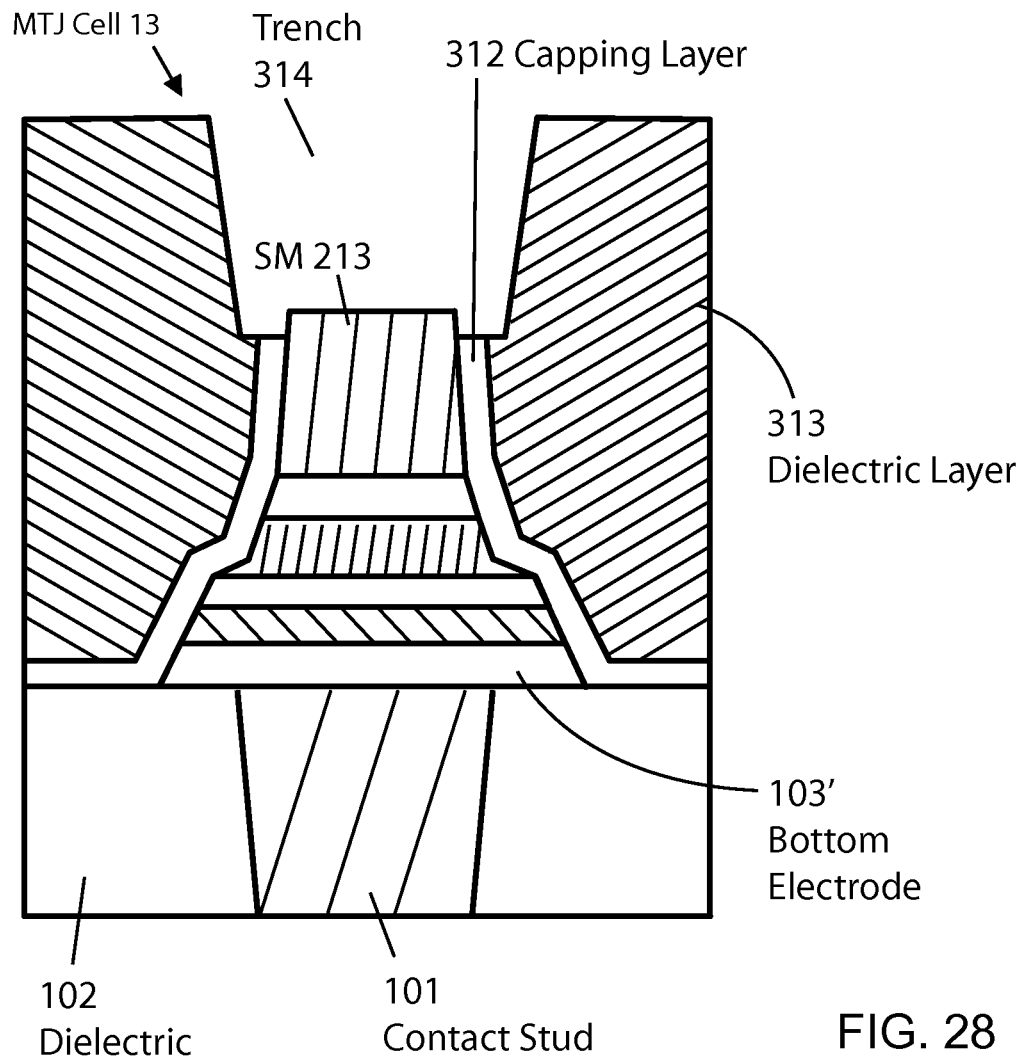
FIG. 28 illustrates a cross sectional view of a process stage of trench formation for the self-aligned via process.
Figure 29:
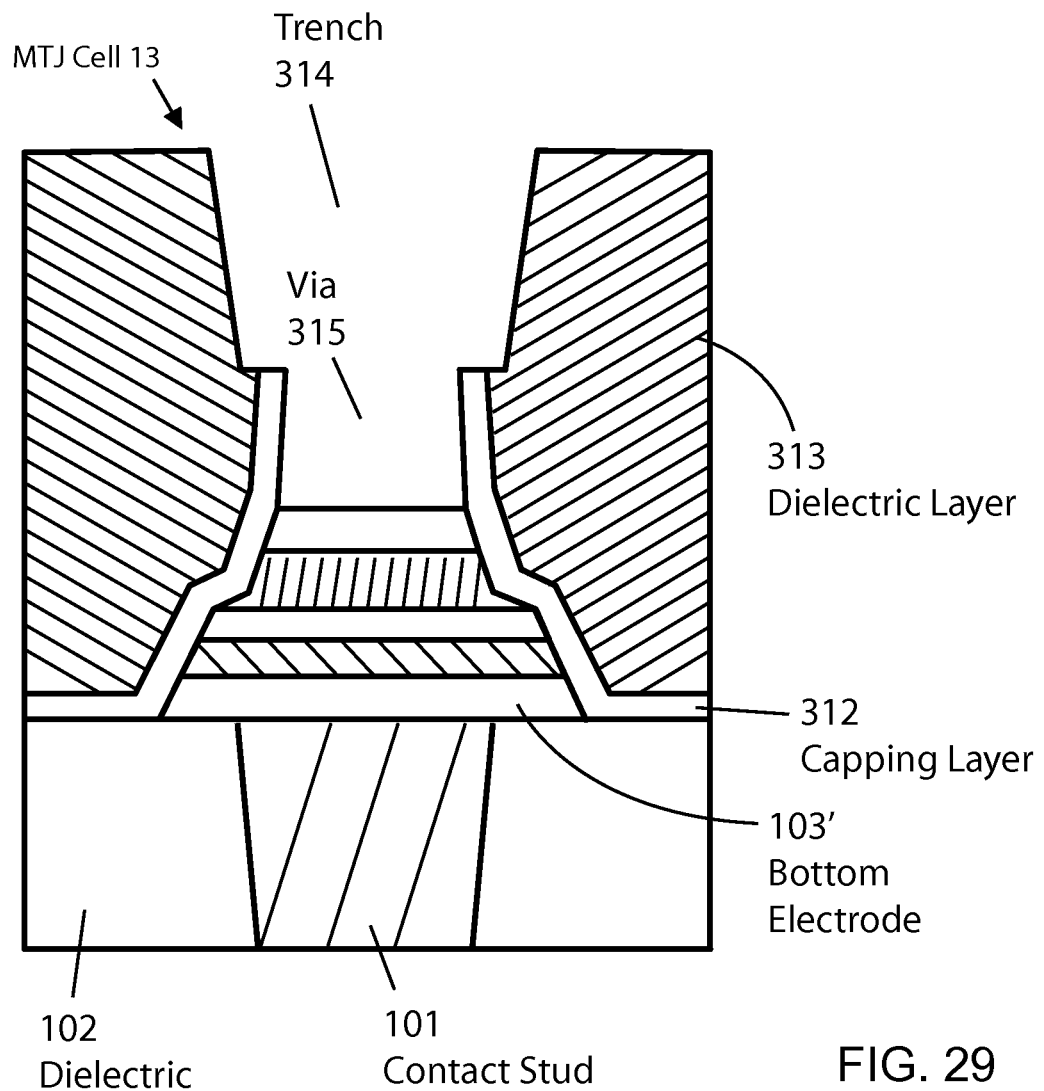
FIG. 29 illustrates a cross sectional view of a process stage subsequent to that of FIG. 28 after selective etching of stud mask.
Figure 30:
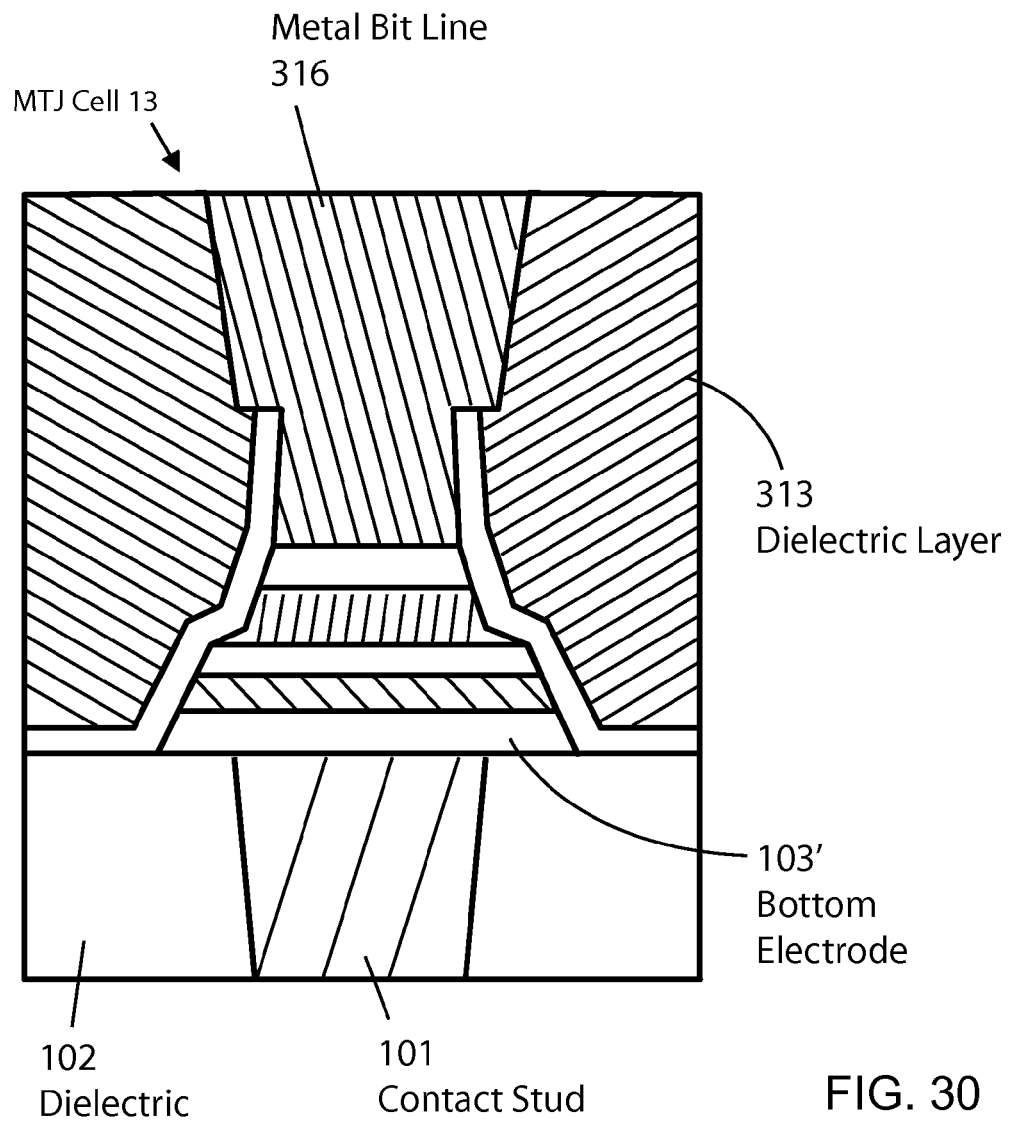
FIG. 30 illustrates a cross sectional view of a process stage subsequent to that of FIG. 29 after the upper metallization fabrication for bit line.

FIGS. 28 to 30 illustrate self-aligned via process using stud mask patterning. A stud mask 213 with sufficient height allows self-aligned via to be formed for the bit line interconnection process as shown in FIG. 28 to FIG. 30. As shown the trench 314 can be etched wider and deeper than the top surface of the SM 213 so that precise alignment is not required and good process margins are provided. The stud mask is preferably a dielectric material, such as aluminum oxide, that can be selectively removed by wet etch. Dielectric film 313 is deposited over the capping layer 312 followed by planarization with CMP as shown in FIG. 28. A trench 314 is then opened in the dielectric film 313 until the stud mask 213 is exposed as shown in FIG. 28.

The stud mask 213 is selectively removed by wet etching with the result as shown in FIG. 29. Via hole 315 is formed where stud mask 213 formerly appeared. Selective removal of the stud mask 213 is facilitated by selecting a material such as aluminum oxide for stud mask 213. Aluminum oxide is easily dissolved in alkali solution but dielectric 313 can be another material that is not dissolved by alkali solution.

Metal is deposited into the trench 314 and via hole 315 followed by CMP to remove the excess metal leaving the bit line metal 316 as shown in FIG. 30.

The invention claimed is:

1. An MRAM cell comprising:
a contact stud with an upper surface that is coplanar with an upper surface of a first dielectric material surrounding the contact stud, the contact stud having a first width;
a bottom electrode with a generally flat lower surface in contact with the upper surface of the contact stud and the upper surface of the first dielectric material surrounding the contact stud, the lower surface of the bottom electrode having a second width that is greater than the first width of the contact stud;
an MTJ in contact with the bottom electrode, the MTJ having a third width that is less than the second width of bottom electrode;
a dielectric capping layer in contact with the MTJ;
a top electrode in contact with the dielectric capping layer; and
a stud etching mask with a lower surface in contact with an upper surface of the top electrode, the lower surface of the stud etching mask being coextensive with the upper surface of the top electrode.

2. An MRAM cell comprising:
a contact stud with an upper surface that is coplanar with an upper surface of a first dielectric material surrounding the contact stud, the contact stud having a first width;
a bottom electrode with a generally flat lower surface in contact with the upper surface of the contact stud and the upper surface of the first dielectric material surrounding the contact stud, the lower surface of the bottom electrode having a second width that is greater than the first width of the contact stud;
an MTJ in contact with the bottom electrode, the MTJ having a third width that is less than the second width of bottom electrode;
a dielectric capping layer in contact with the MTJ; and
a stud etching mask with a lower surface in contact with an upper surface of the dielectric capping layer, the lower surface of the stud etching mask being coextensive with the upper surface of the dielectric capping layer.

3. An MRAM cell comprising:
a contact stud with an upper surface that is coplanar with an upper surface of a first dielectric material surrounding the contact stud, the contact stud having a first width;
a bottom electrode with a generally flat lower surface in contact with the upper surface of the contact stud and the upper surface of the first dielectric material surrounding the contact stud, the lower surface of the bottom electrode having a second width that is greater than the first width of the contact stud;
an MTJ in contact with the bottom electrode, the MTJ having a third width that is less than the second width of bottom electrode;
a capping layer in contact with the MTJ;
a top electrode in contact with the capping layer; and
a stud etching mask with a lower surface in contact with an upper surface of the top electrode, the lower surface of the stud etching mask being coextensive with the upper surface of the top electrode.

4. An MRAM cell comprising:
a contact stud with an upper surface that is coplanar with an upper surface of a first dielectric material surrounding the contact stud, the contact stud having a first width;
a bottom electrode with a generally flat lower surface in contact with the upper surface of the contact stud and the upper surface of the first dielectric material surrounding the contact stud, the lower surface of the bottom electrode having a second width that is greater than the first width of the contact stud;
an MTJ in contact with the bottom electrode, the MTJ having a third width that is less than the second width of bottom electrode;
a capping layer in contact with the MTJ; and
a stud etching mask with a lower surface in contact with an upper surface of the capping layer, the lower surface of the stud etching mask being coextensive with the upper surface of the capping layer.

* * * * *